(12) United States Patent
Kusai et al.

(10) Patent No.: US 8,450,709 B2
(45) Date of Patent: May 28, 2013

(54) NONVOLATILE RESISTANCE CHANGE DEVICE

(75) Inventors: Haruka Kusai, Kanagawa (JP); Shosuke Fujii, Kanagawa (JP); Yasushi Nakasaki, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 283 days.

(21) Appl. No.: 13/052,165

(22) Filed: Mar. 21, 2011

(65) Prior Publication Data

US 2012/0091420 A1 Apr. 19, 2012

(30) Foreign Application Priority Data

Oct. 15, 2010 (JP) .................................. 2010-232655

(51) Int. Cl.
*H01L 29/02* (2006.01)
(52) U.S. Cl.
USPC .... 257/2; 257/4; 257/E45.001; 257/E45.002; 257/E45.003; 365/148
(58) Field of Classification Search
USPC .......... 257/2, 4, E45.001, E45.002, E45.003; 438/382, 385, 467; 365/148
See application file for complete search history.

(56) References Cited

U.S. PATENT DOCUMENTS

| | | | | |
|---|---|---|---|---|
| 4,162,411 | A * | 7/1979 | Sakaue et al. ................... | 377/75 |
| 6,534,401 | B2 * | 3/2003 | Joo et al. ....................... | 438/653 |
| 7,910,979 | B2 * | 3/2011 | Matsuoka et al. ............. | 257/324 |
| 7,989,789 | B2 * | 8/2011 | Toda ................................ | 257/2 |
| 2007/0105334 | A1 * | 5/2007 | Jang et al. ..................... | 438/396 |
| 2009/0014707 | A1 * | 1/2009 | Lu et al. .......................... | 257/4 |
| 2009/0231910 | A1 * | 9/2009 | Liu et al. ........................ | 365/163 |
| 2010/0213433 | A1 * | 8/2010 | Yamamoto et al. ............. | 257/4 |
| 2012/0007035 | A1 * | 1/2012 | Jo et al. ........................... | 257/4 |
| 2012/0074507 | A1 * | 3/2012 | Jo et al. ......................... | 257/379 |
| 2012/0091420 | A1 * | 4/2012 | Kusai et al. ....................... | 257/4 |
| 2012/0211719 | A1 * | 8/2012 | Haimoto et al. ................... | 257/4 |
| 2012/0305879 | A1 * | 12/2012 | Lu et al. ............................ | 257/4 |
| 2012/0320660 | A1 * | 12/2012 | Nazarian et al. .............. | 365/148 |

OTHER PUBLICATIONS

U.S. Appl. No. 13/228,753, filed Sep. 9, 2011, Haimoto, et al.
Sung Hyun Jo et al., "CMOS Compatible Nanoscale Nonvolatile Resistance Switching Memory", Nano Letters, vol. 8, No. 2, 2008, pp. 392-397.
K. Kinoshita et al., "Reduction in the Reset Current in a Resistive Random Access Memory Consisting of $NiO_x$ Brought About by Reducing a Parasitic Capacitance", Applied Physics letters, vol. 93, 033506 (2008), pp. 033506-1-033506-3.

* cited by examiner

*Primary Examiner* — Jarrett Stark
(74) *Attorney, Agent, or Firm* — Oblon, Spivak, McClelland, Maier & Neustadt, L.L.P.

(57) ABSTRACT

According to one embodiment a first variable resistance layer which is arranged between a second electrode and a first electrode and in which a first conductive filament is capable of growing based on metal supplied from the second electrode, and an n-th variable resistance layer which is arranged between an n-th electrode and an (n+1)-th electrode and in which an n-th conductive filament whose growth rate is different from the first conductive filament is capable of growing based on metal supplied from the (n+1)-th electrode are included, a configuration in which a plurality of conductive filaments is electrically connected in series between the first electrode layer and the (n+1)-th electrode layer is included, and a resistance is changed in a stepwise manner.

20 Claims, 16 Drawing Sheets

NONVOLATILE RESISTANCE CHANGE DEVICE

CROSS-REFERENCE TO RELATED APPLICATIONS

This application is based upon and claims the benefit of priority from the prior Japanese Patent Application No. 2010-232655, filed on Oct. 15, 2010; the entire contents of which are incorporated herein by reference.

FIELD

Embodiments described herein relate generally to a nonvolatile resistance change device.

BACKGROUND

A NAND-type flash memory is widely used as a storage device for large-capacity data. Currently, cost reduction and increase in capacity per bit have progressed by miniaturizing a storage device, and further progress in miniaturization is required in the future. However, for further miniaturizing a flash memory, there are many problems to be solved such as suppression of a short channel effect, cell interferences, and variations between elements. Therefore, practical use of a novel storage device to replace a conventional floating gate-type flash memory is expected.

Recently, development of a two-terminal nonvolatile resistance change device represented by a ReRAM (Resistive Random Access Memory) has been actively carried out. This nonvolatile resistance change device is a promising candidate as a next-generation large-capacity storage device to replace the conventional floating gate-type flash memory in terms of a low-voltage operation, a high-speed switching, and a miniaturization capability. Specially, a memory in which amorphous silicon is used for a variable resistance layer attracts attention in terms of a high switching probability and the miniaturization capability.

The multi-level bit capability of a memory device increases storage density and functionality. As a technology for realizing multi-level bit capability of the above described two-terminal nonvolatile resistance change device, a method (current compliance control method) is employed in which the amount of current flowing into the nonvolatile resistance change device is controlled when changing from an off-state to an on-state.

In multi-level bit capability by such current compliance control method, reliability of the nonvolatile resistance change device is greatly affected, for example, by variation in resistance value due to an inflowing current from a parasitic capacitance of interconnection and a degree of expansion and contraction of a conductive filament. So, the current compliance control method may not be well-controlled filament formation and reduction.

Specially, the influence of the parasitic capacitance of interconnection on the reliability of a set operation (operation of transitioning from the off-state to the on-state) is large, so that it is pointed out that transistors need to be adjacent to each memory cell for performing an operation with a high reliability by the current compliance method.

DETAILED DESCRIPTION

In general, according to one embodiment, a first variable resistance layer, a second electrode, . . . , an n-th electrode, an n-th variable resistance layer, and an (n+1)-th electrode (n is a natural number greater than or equal to two) are stacked in this order in a first direction vertical to a surface of a first electrode, and the first variable resistance layer which is arranged between the second electrode and the first electrode and in which a first conductive filament is capable of growing based on metal supplied from the second electrode, and the n-th variable resistance layer (n is a natural number greater than or equal to two) which is arranged between the n-th electrode and the (n+1)-th electrode and in which an n-th conductive filament whose growth rate is different from the first conductive filament is capable of growing based on metal supplied from the (n+1)-th electrode are included. A plurality of conductive filaments can be electrically connected in series between the first electrode layer and the (n+1)-th electrode layer is included, and a resistance can be changed in a stepwise manner.

Exemplary embodiments of a nonvolatile resistance change device will be explained below in detail with reference to the accompanying drawings. The present invention is not limited to the following embodiments.

First Embodiment

Figure 1:
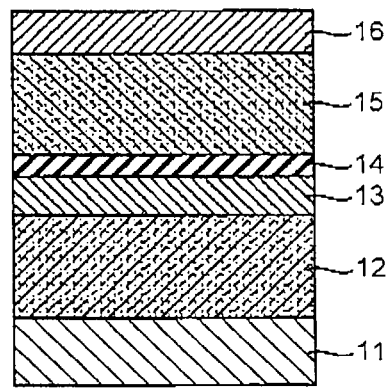
FIG. 1 is a cross-sectional view illustrating a schematic configuration of a nonvolatile resistance change device according to a first embodiment of the invention.

FIG. 1 is a cross-sectional view illustrating a schematic configuration of a nonvolatile resistance change device according to the first embodiment.

In FIG. 1, a first variable resistance layer 12 is arranged between a first electrode 11 and a second electrode 13, and a second variable resistance layer 15 is arranged between the second electrode 13 and a third electrode 16. In the first variable resistance layer 12, a first conductive filament can grow based on metal supplied from the second electrode 13. In the second variable resistance layer 15, a second conductive filament can grow based on metal supplied from the third electrode 16. The growth rate of the first conductive filament grown in the first variable resistance layer 12 is at a slower rate than that of the second conductive filament grown in the second variable resistance layer 15.

A diffusion barrier layer 14 is arranged between the second electrode 13 and the second variable resistance layer 15, which prevents the metal supplied from the third electrode 16 from diffusing and mixing with the second electrode 13 or prevents the metal of the second electrode 13 from diffusing in the second variable resistance layer 15.

As the first electrode 11, for example, it is possible to use an active region of an exemplary Si substrate formed by doping boron at a high concentration and by a heat treatment. The sheet resistance of this region can be set, for example, equal to or lower than $3 \times 10^3 \Omega/\square$.

A metal element can be the main component of the second electrode 13 and the third electrode 16. The metal included in the second electrode 13 and the metal included in the third electrode 16 are selected to be different from each other. Amorphous silicon, monocrystalline silicon or polysilicon can be the main component of the first variable resistance layer 12 and the second variable resistance layer 15.

The metal included in the second electrode 13 and the metal included in the third electrode 16 can be selected so that at least any one of a diffusion rate in amorphous silicon or polysilicon, a diffusion activation barrier in a neutral atom state or an ionized state, or an electrical specific resistance is different from each other.

For example, when Si is the main component of the first variable resistance layer 12 and the second variable resistance layer 15, a metal material which can be applied to the second electrode 13 and the third electrode 16 and whose diffusion rate in Si is fast includes Ag, Cu, Ni, Fe, Ru, Cr, Ir, Au, Pt, Co, and the like. Moreover, a metal material whose diffusion rate in Si is slow includes Ti, Hf, Zr, Ta, Al, W and the like.

Moreover, the film thickness of the first variable resistance layer 12 and the second variable resistance layer 15 can be typically set to 1 nm to 300 nm, and can be set to, for example, 150 nm. For miniaturizing the nonvolatile resistance change device, the film thickness of the first variable resistance layer 12 and the second variable resistance layer 15 is preferably thinner, however, if the film thickness is too thin, an uniform film cannot be formed, so that the film thickness thereof is more preferably 2 nm to 50 nm.

Furthermore, the number of the electrode layers separated by the first variable resistance layer 12 and the second variable resistance layer 15 does not always need to be three, and it is sufficient that the number of the electrode layers separated by the variable resistance layers is three or more. The film thickness of the first electrode 11, the second electrode 13, and the third electrode 16 can be typically set to 1 nm to 200 nm, and can be set to, for example, 50 nm. It is applicable that the film thickness of the first electrode 11, the second electrode 13, and the third electrode 16 is different from each other.

Moreover, the diffusion barrier layer 14 can be formed of a material whose dielectric constant is different from amorphous silicon or polysilicon used as the first variable resistance layer 12 and the second variable resistance layer 15 or a material whose diffusion rate of metal is slow such as oxide, nitride, boride, or oxynitride of Ti, Zr, Ta, W, or Si. For example, as a material whose dielectric constant is higher than amorphous silicon or polysilicon, $Ta_2O_5$, $La_2O_3$, $HfO_2$, $ZrO_2$, $ZrAl_xO_y$, $HfAl_xO_y$, or the like can be used. As a material whose dielectric constant is lower than amorphous silicon or polysilicon, $SiO_2$, $Si_3N_4$, $Al_2O_3$, or the like can be used.

For example, as the diffusion barrier layer 14, an $SiO_2$ film whose dielectric constant is lower than the second variable resistance layer 15 can be used. The diffusion barrier layer 14 preferably has a thickness of 100 nm or less. The resistance value increases in some cases by interposing the diffusion barrier layer 14 between the second electrode 13 and the second variable resistance layer 15, however, the resistance value of the nonvolatile resistance change device can be decreased by setting the thickness of the diffusion barrier layer 14 to be 100 nm or less.

Then, a conductive filament is formed in any one of the first variable resistance layer 12 and the second variable resistance layer 15, a conductive filament is formed in both of the first variable resistance layer 12 and the second variable resistance layer 15, or conductive filaments of the first variable resistance layer 12 and the second variable resistance layer 15 are caused to disappear, to realize multi-level bit capability of a nonvolatile resistance change device. The physical principle of formation this conductive filament differs according to the material constructing the first variable resistance layer 12 and the second variable resistance layer 15. For example, when NiO is used as the first variable resistance layer 12 and the second variable resistance layer 15, it is considered that Joule heating affects resistance switching behavior.

Moreover, when amorphous silicon is used as the first variable resistance layer 12 and the second variable resistance layer 15, a conductive filament is formed by oxidation-reduction reaction with the first variable resistance layer 12 and the second variable resistance layer 15 as solid electrolyte.

It is preferable to use amorphous silicon or polysilicon for the first variable resistance layer 12 and the second variable resistance layer 15 so that a conductive filament is formed and disappears by the same principle. Moreover, the second variable resistance layer 15 is stacked on the first variable resistance layer 12 via the second electrode 13, so that a switching operation can be performed by connecting or separating the conductive filament formed in the first variable resistance layer 12 and the conductive filament formed in the second variable resistance layer 15, whereby variation in state of the conductive, filament at multi-level bit capability can be reduced.

It is applicable to select the metal included in the second electrode 13 and the metal included in the third electrode 16 so that a cohesive energy is different from each other. This is because a driving voltage becomes high as the cohesive energy of metal is large. Examples of metal having a low cohesive energy include Ag and Al, and examples of metal having a high cohesive energy include Ni and Co.

Next, the manufacturing method of the nonvolatile resistance change device in FIG. 1 is explained.

In FIG. 1, after $B^+$ ion is implanted in a silicon single-crystal substrate, a p-type Si region as the first electrode 11 is fabricated by activation annealing. The sheet resistance of this p-type Si region can be set to 3 to $3 \times 10^3 \Omega/\square$.

Next, for example, amorphous silicon is deposited on the p-type Si region by a Chemical Vapor Deposition (CVD) method to form the first variable resistance layer 12 on the first electrode 11.

Next, for example, Ti whose diffusion rate in Si is slow is deposited on the amorphous silicon by a method such as sputtering to form the second electrode 13 on the first variable resistance layer 12.

Next, for example, $HfO_2$ having a dielectric constant higher than amorphous silicon is deposited on Ti by a method such as sputtering to form the diffusion barrier layer 14 on the second electrode 13.

Next, for example, amorphous silicon is deposited on $HfO_2$ by the CVD method to form the second variable resistance layer 15 on the diffusion barrier layer 14.

Next, for example, Ag whose diffusion rate in Si is fast is deposited on amorphous silicon by a method such as sputtering to form the third electrode 16 on the second variable resistance layer 15. Ti whose diffusion rate in Si is slow has a low diffusion barrier in a neutral atom state compared with a positively ionized state. On the other hand, Cu or Ag whose diffusion rate in Si is fast has a high diffusion barrier in a neutral atom state compared with a positively ionized state.

Figure 2A:
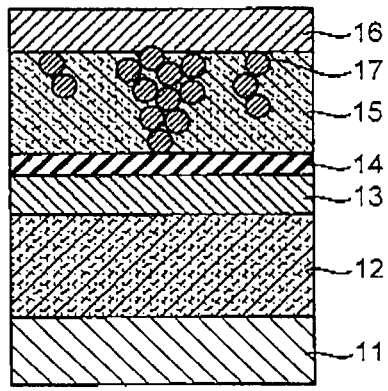
FIG. 2A is a cross-sectional view illustrating a first on-state of the nonvolatile resistance change device according to the first embodiment.
Figure 2B:
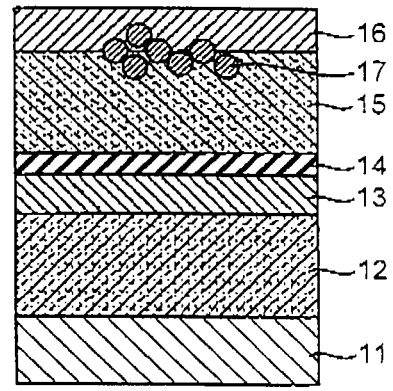
FIG. 2B is a cross-sectional view illustrating an off-state of the nonvolatile resistance change device according to the first embodiment.

FIG. 2A is a cross-sectional view illustrating a first on-state of the nonvolatile resistance change device according to the first embodiment, and FIG. 2B is a cross-sectional view illustrating an off-state of the nonvolatile resistance change device according to the first embodiment.

In FIG. 2A, if the nonvolatile resistance change device is in the state of FIG. 1, a positive voltage applied to the third electrode 16 with respect to the first electrode 11 generates electric fields that drive the metal (atoms or ions), ions are diffused in the second variable resistance layer 15, whereby a conductive filament 17 is formed.

This conductive filament 17 is consist of metal and thus has a high conductivity, so that the resistance of the second variable resistance layer 15 becomes lower than the state of FIG. 1. When a negative voltage applied to the third electrode 16 with respect to the first electrode 11 generates electric fields that drive the metal (atoms or ions), from the state of FIG. 2A, as shown in FIG. 2B, the metal (atoms or ions) formed conductive filament that is present in the second variable resistance layer 15 is diffused in the third electrode 16 direction by the applied electric field, so that the conductive filament 17 eliminates.

Consequently, in the state of FIG. 2B, the resistance of the second variable resistance layer 15 becomes higher than the state of FIG. 2A. When a positive voltage applied to the third electrode 16 with respect to the first electrode 11 generates electric fields that drive the metal (atoms or ions), from the state of FIG. 2B, as shown in FIG. 2A, the conductive filament 17 is formed again. In other words, the state of FIG. 2A and the state of FIG. 2B can be reversibly controlled. These two states correspond to an on-state and an off-state, respectively, so that a binary nonvolatile resistance change memory can be realized.

Next, the method of multi-level bit capability of the nonvolatile resistance change device is explained.

As described above, the second electrode 13 and the third electrode 16 consist of metals whose diffusion rate in the first variable resistance layer 12 and in the second variable resistance layer 15, respectively, is different from each other, so that the formation and the elimination rate of the conductive filament is different. Multi-level bit capability of the nonvolatile resistance change device can be realized by using the difference in diffusion rate. Moreover, the configuration in which a plurality of conductive filaments is electrically connected in series is included, so that the nonvolatile resistance change device is characterized in a stepwise resistance change.

Figure 3A:
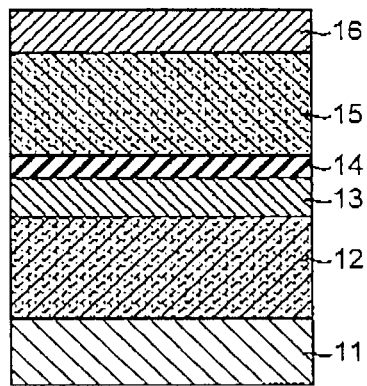
FIG. 3A to FIG. 3C are cross-sectional views illustrating a formation process of a conductive filament at the time of writing of the nonvolatile resistance change device according to the first embodiment.
Figure 3D:
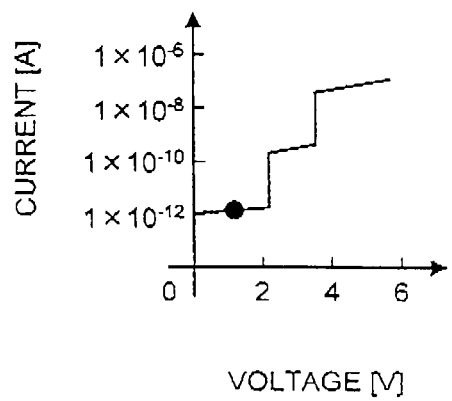
FIG. 3D to FIG. 3F are diagrams illustrating current-voltage characteristics at the time of writing of the nonvolatile resistance change device according to the first embodiment.
Figure 3B:
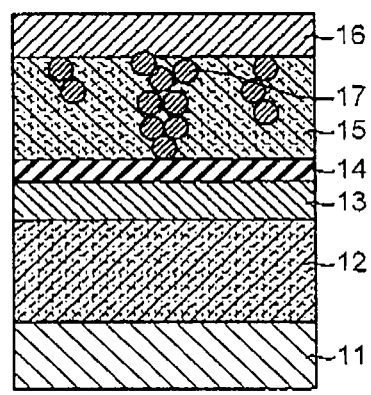
Figure 3E:
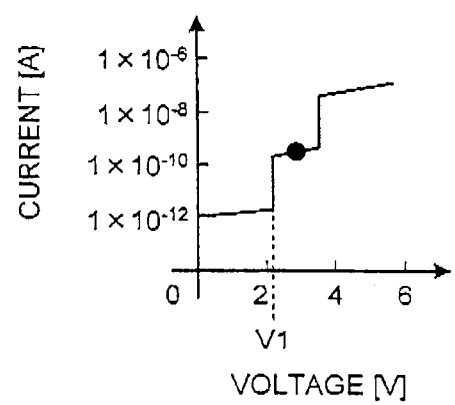
Figure 3C:
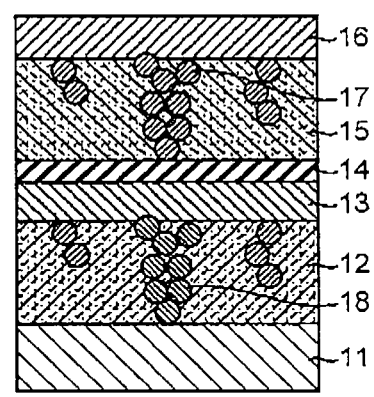
Figure 3F:
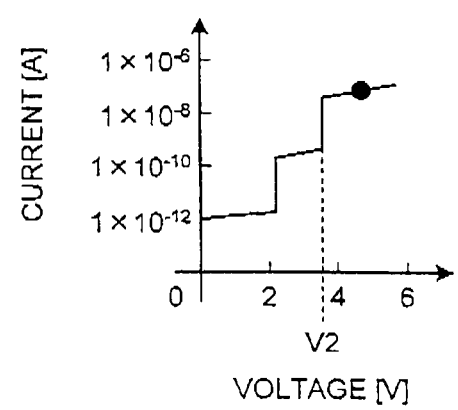

FIG. 3A to FIG. 3C are cross-sectional views illustrating a formation process of a conductive filament at the time of writing of the nonvolatile resistance change device according to the first embodiment, and FIG. 3D to FIG. 3F are diagrams illustrating current-voltage characteristics at the time of writing of the nonvolatile resistance change device according to the first embodiment.

In FIG. 3A, in the state where the conductive filaments 17 and 18 are not formed in the second variable resistance layer 15 and the first variable resistance layer 12, as shown in FIG. 3D, even if the voltage applied to the third electrode 16 rises, the current that flows between the first electrode 11 and the third electrode 16 is substantially constant.

Then, when the voltage applied to the third electrode 16 reaches V1, as shown in FIG. 3B, the conductive filament 17 that reaches the diffusion barrier layer 14 from the third electrode 16 is formed in the second variable resistance layer 15 and the current that flows between the first electrode 11 and the third electrode 16 rises in a stepwise manner. This is because the potential becomes the same between the third electrode 16 and the second electrode 13 by the conductive filament 17 formed in the second variable resistance layer 15 and therefore the resistance of the nonvolatile resistance change device becomes small.

In the case where the film thickness and the material are the same in the first variable resistance layer 12 and the second variable resistance layer 15, when a positive voltage applied to the third electrode 16 with respect to the first electrode 11 generates electric fields that drive the metal (atoms or ions) from the state of FIG. 3A, substantially the same electric field is applied to the first variable resistance layer 12 and the second variable resistance layer 15. Therefore, the conductive filament 17 can be selectively formed in the second variable resistance layer 15 by formation the third electrode 16 with a metal material whose diffusion rate in Si is fast and formation the second electrode 13 with a metal material whose diffusion rate in Si is slow.

Moreover, the metal included in the conductive filament 17 can be prevented from coming into contact with the second electrode 13 by providing the diffusion barrier layer 14, so that it is prevented that the metal included in the third electrode 16 and the metal included in the second electrode 13 are mixed.

In the state where the conductive filament 17 is formed in the second variable resistance layer 15 and the conductive filament 18 is not formed in the first variable resistance layer 12, as shown in FIG. 3E, even if the voltage applied to the third electrode 16 further rises from V1, the current that flows between the first electrode 11 and the third electrode 16 becomes substantially constant.

Then, when the voltage applied to the third electrode 16 reaches V2, as shown in FIG. 3C, the conductive filament 18 that reaches the first electrode 11 from the second electrode 13 is formed in the first variable resistance layer 12 and the current that flows between the first electrode 11 and the third electrode 16 rises in a stepwise manner. This is because the potential becomes the same between the second electrode 13 and the first electrode 11 by forming the conductive filament 18 in the first variable resistance layer 12 and therefore the resistance of the nonvolatile resistance change device becomes smaller.

When a positive voltage applied to the third electrode 16 with respect to the first electrode 11 generates electric fields that drive the metal (atoms or ions) from the state of FIG. 3B, because the resistance of the second variable resistance layer 15 is lower than the first variable resistance layer 12, so that the electric field is applied to the first variable resistance layer 12. Therefore, even when the second electrode 13 is formed of a metal material whose diffusion rate in Si is slow, the conductive filament 18 can be formed in the first variable resistance layer 12.

Then, in the state where the conductive filaments 17 and 18 are formed in the second variable resistance layer 15 and the first variable resistance layer 12, as shown in FIG. 3F, even if the voltage applied to the third electrode 16 further rises from V2, the current that flows between the first electrode 11 and the third electrode 16 becomes substantially constant.

Consequently, the current that flows between the first electrode 11 and the third electrode 16 can be changed in a stepwise manner between the states of FIG. 3A to FIG. 3C, so that multi-level bit capability of the nonvolatile resistance change device can be realized while suppressing an error detection of the states of FIG. 3A to FIG. 3C.

The above voltages V1 and V2 are typically in the range of 0.1 V to 15 V. For realizing miniaturization of the nonvolatile resistance change device, the nonvolatile resistance change device is desirably driven at a lower voltage and the voltages V1 and V2 are preferably in the range of 0.1 V to 6 V. In the case of the present embodiment, V1 is about 2.5 V and V2 is about 3.2 V, and current of about 10 nA to 100 nA flows in the on-state in which a plurality of conductive filaments is electrically connected in series.

Figure 4A:
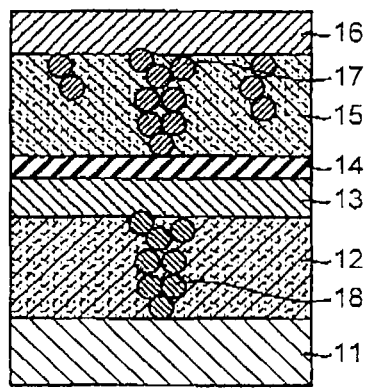
FIG. 4A to FIG. 4C are cross-sectional views illustrating a elimination process of a conductive filament at the time of erasing of the nonvolatile resistance change device according to the first embodiment.
Figure 4D:
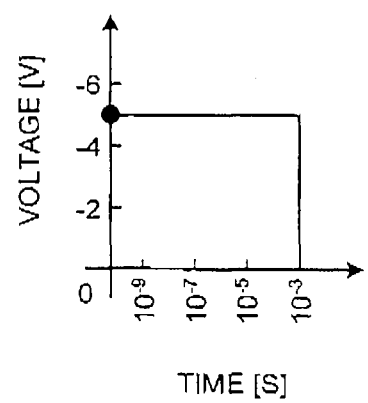
FIG. 4D to FIG. 4F are diagrams illustrating an application time of a voltage at the time of erasing of the nonvolatile resistance change device according to the first embodiment.
Figure 4B:
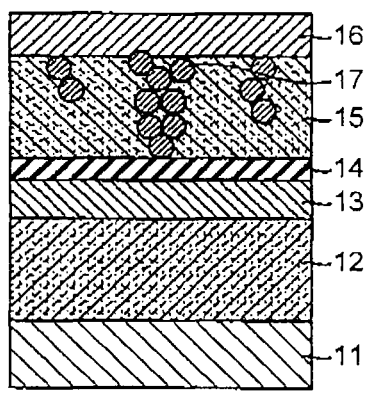
Figure 4E:
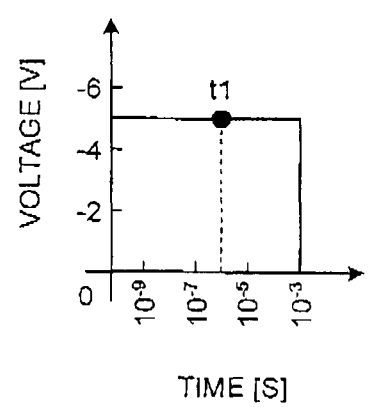
Figure 4C:
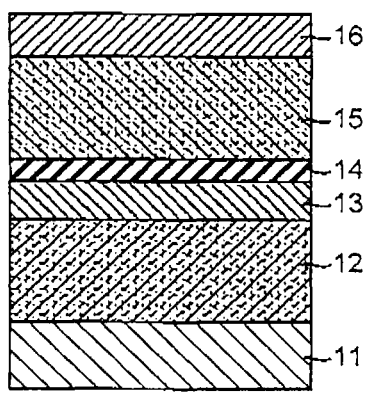
Figure 4F:
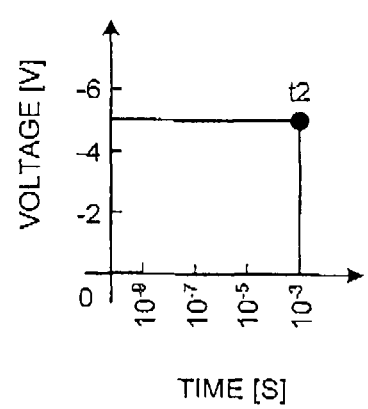

FIG. 4A to FIG. 4C are cross-sectional views illustrating a disappearing process of a conductive filament at the time of erasing of the nonvolatile resistance change device according to the first embodiment, and FIG. 4D to FIG. 4F are diagrams illustrating an application time of a voltage at the time of erasing of the nonvolatile resistance change device according to the first embodiment.

When causing the conductive filaments 17 and 18 to eliminate from the state of FIG. 4A, as shown in FIG. 4D, a negative voltage applied to the third electrode 16 with respect to the first electrode 11. Elimination of the conductive filament 18 is considered to occur in two stages. First, injection of holes from the first electrode 11 to the conductive filament 18 occurs and the metal atoms in the conductive filament 18 are ionized. Then, the metal atoms in the conductive filament 18 are retracted to the direction of the second electrode 13 by the electric field applied to the conductive filament 18 from the first electrode 11.

Then, because the metal atoms that form the conductive filament 18 in the first variable resistance layer 12 return to the second electrode 13, the conductive filament 18 retracts. Then, as shown in FIG. 4E, when time t1 elapses from the start of the voltage application, the conductive filament 18 in the first variable resistance layer 12 finally disappears as shown in FIG. 4B under the condition where sufficient ionization keeps occurring.

When the conductive filament 18 in the first variable resistance layer 12 eliminates, the electric filed is applied to the first variable resistance layer 12 that is in contact with the first electrode 11 and the diffusion barrier layer 14. Moreover, as shown in FIG. 4F, when a voltage with which the third electrode 16 becomes negative is kept applying until time t2, the metal atoms that form the conductive filament 17 in the second variable resistance layer 15 are ionized, and as shown in FIG. 4C, return to a direction of the third electrode 16, so that the conductive filament 17 eliminates.

The state at this time where all the conductive filaments 17 and 18 that electrically connect the first electrode 11, the second electrode 13, and the third electrode 16 eliminate is defined as an off-state. Because the diffusion barrier layer 14 is arranged on the second electrode 13, the metal ions of the second electrode 13 can be prevented from diffusing in the direction of the third electrode 16.

The hole injection from the first electrode 11 to the conductive filament 18 and the hole injection from the second electrode 13 to the conductive filament 17 can be controlled by the electrical resistivity of the first variable resistance layer 12 and the second variable resistance layer 15. The degree of retraction of the conductive filaments 17 and 18 can be controlled based on the ease of the hole injection to the conductive filaments 17 and 18 and thus can be controlled based on the electrical resistivity of the first variable resistance layer 12 and the second variable resistance layer 15. Moreover, the diffusion rate of the ionized metal in the first variable resistance layer 12 and the second variable resistance layer 15 can be modulated depending on the strength of a chemical bond between impurities doped in the first variable resistance layer 12 and the second variable resistance layer 15 and metal atoms.

The degree of a voltage with which the third electrode 16 becomes negative is typically in the range of −0.1 V to −15 V. For realizing miniaturization of the nonvolatile resistance change device, the nonvolatile resistance change device is desirably driven at a voltage whose absolute value is low and the voltage is more desirably in the range of −0.1 V to −6 V. In the case of the present embodiment, the nonvolatile resistance change device is desirably driven with the time t1 and the time t2 being set to 1 ns to 10 ms, however, the time t1 and the time t2 are desirably set to a short time in the range of 1 ns to 1 µs.

When a positive voltage applied to the third electrode 16 with respect to the first electrode 11 from the state of FIG. 4C (i.e., FIG. 3A), it is possible to change to the states of FIG. 3B and FIG. 3C. Therefore, if the state of FIG. 4C (i.e., FIG. 3A) corresponds to an off-state, the state of FIG. 4B (i.e., FIG. 3B) corresponds to a first on-state, and the state of FIG. 4A (i.e., FIG. 3C) corresponds to a second on-state, these three states can be reversibly changed, whereby a three-level nonvolatile resistance change memory can be realized.

It is possible to realize a four or more level nonvolatile resistance change device that is characterized in that a resistance is changed in a stepwise manner by stacking a first variable resistance layer, a second electrode, . . . , an n-th electrode, an n-th variable resistance layer, and an (n+1)-th electrode (n is a natural number greater than or equal to two) in this order in a first direction vertical to a surface of a first electrode, including the first variable resistance layer which is arranged between the second electrode and the first electrode and in which a first conductive filament is capable of growing based on metal supplied from the second electrode, and the n-th variable resistance layer (n is a natural number greater than or equal to two) which is arranged between the n-th electrode and the (n+1)-th electrode and in which an n-th conductive filament whose growth rate is different from the first conductive filament is capable of growing based on metal supplied from the (n+1)-th electrode, and including a configuration in which a plurality of conductive filaments is electrically connected in series between the first electrode layer and the (n+1)-th electrode layer.

Moreover, in the above embodiment, difference in diffusion phenomenon, that is, diffusion rate and reactivity of the metal ions of the second electrode 13 and the third electrode 16 is used for multi-level bit capability of the nonvolatile resistance change memory, so that multi-level bit capability by voltage control can be performed, enabling to improve reliability compared with the method of multi-level bit capability by the current compliance.

Second Embodiment

Figure 5:
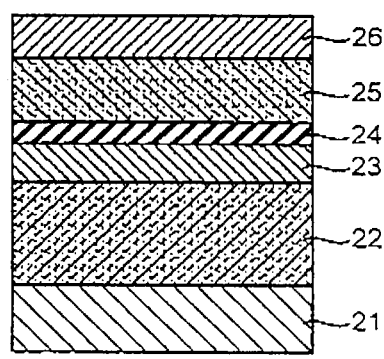
FIG. 5 is a cross-sectional view illustrating a schematic configuration of a nonvolatile resistance change device according to a second embodiment of the invention.

FIG. 5 is a cross-sectional view illustrating a schematic configuration of a nonvolatile resistance change device according to the second embodiment.

In FIG. 5, in this nonvolatile resistance change device, a first electrode 21, a first variable resistance layer 22, a second electrode 23, a diffusion barrier layer 24, a second variable resistance layer 25, and a third electrode 26 are sequentially stacked. The film thickness of the first variable resistance layer 22 and the second variable resistance layer 25 is different from each other. Other points are similar to the configuration in FIG. 1.

Figure 6A:
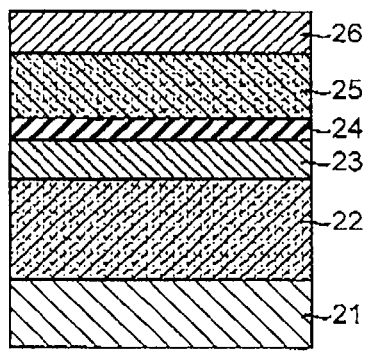
FIG. 6A to FIG. 6C are cross-sectional views illustrating a formation process of a conductive filament at the time of writing of the nonvolatile resistance change device according to the second embodiment.
Figure 6D:
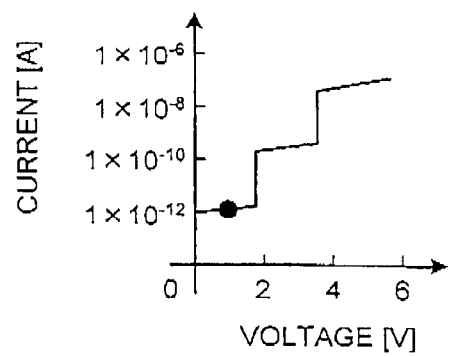
FIG. 6D to FIG. 6F are diagrams illustrating current-voltage characteristics at the time of writing of the nonvolatile resistance change device according to the second embodiment.
Figure 6B:
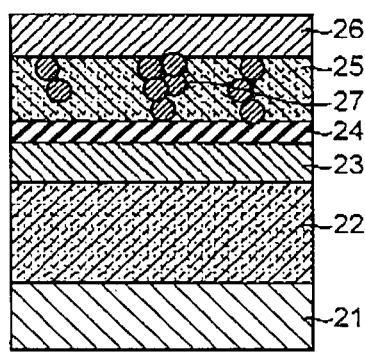
Figure 6E:
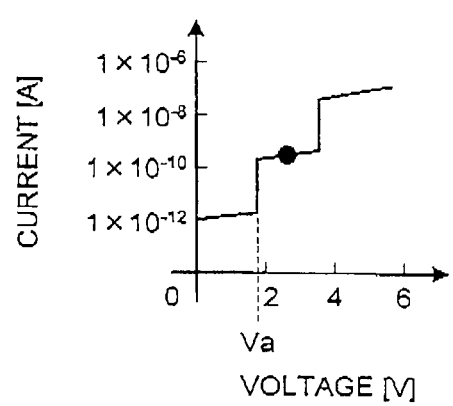
Figure 6C:
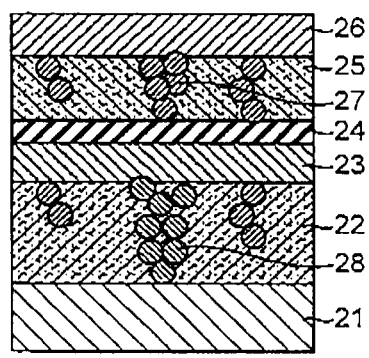
Figure 6F:
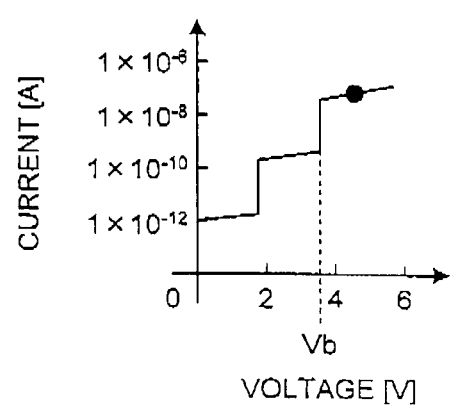

FIG. 6A to FIG. 6C are cross-sectional views illustrating a forming process of a conductive filament at the time of writing of the nonvolatile resistance change device according to the second embodiment, and FIG. 6D to FIG. 6F are diagrams illustrating current-voltage characteristics at the time of writing of the nonvolatile resistance change device according to the second embodiment.

In FIG. 6A, a positive voltage applied to the third electrode 26 with respect to the first electrode 21 from the state where conductive filaments 27 and 28 are not formed. At this time, as shown in FIG. 6D, even if the voltage applied to the third electrode 26 rises, the current that flows between the first electrode 21 and the third electrode 26 is substantially constant.

Then, as shown in FIG. 6E, when the voltage of the third electrode 26 reaches Va, as shown in FIG. 6B, the conductive filament 27 formed of the metal ions included in the third electrode 26 is formed in the second variable resistance layer 25.

This conductive filament 27 is preferentially formed as the metal (atoms or ions) included in the third electrode 26 is diffused more easily or the film thickness of the second variable resistance layer 25 is smaller. Therefore, the switching speed at the time of multi-level bit capability of the nonvolatile resistance change device can be controlled by changing the metal of the third electrode 26 and the film thickness of the second variable resistance layer 25.

Thereafter, the voltage of the third electrode 26 further rises, and as shown in FIG. 6F, when the voltage of the third electrode 26 reaches Vb, as shown in FIG. 6C, the conductive filament 28 formed of the metal (atoms or ions) included in the second electrode 23 is formed in the first variable resistance layer 22 and the resistance of the nonvolatile resistance change device becomes smaller. The above voltages Va and Vb are typically in the range of 0.1 V to 15 V. For realizing miniaturization of the nonvolatile resistance change device, the nonvolatile resistance change device is desirably driven at a lower voltage and the voltages Va and Vb are preferably in the range of 0.1 V to 6 V.

In this manner, multi-level bit capability of the nonvolatile resistance change device can be realized by using the phenomenon that the resistance of the nonvolatile resistance change device changes in a stepwise manner with respect to the applied voltage. The erase operation is similar to the time of formation the conductive filaments 27 and 28 except that the direction of charge injection to the conductive filaments 27 and 28 becomes opposite to the write operation and the electrical resistivity of the first variable resistance layer 22 and the second variable resistance layer 25 affects the charge injection.

It is possible to realize a four or more level nonvolatile resistance change device that is characterized in that a resistance is changed in a stepwise manner by stacking a first variable resistance layer, a second electrode, . . . , an n-th electrode, an n-th variable resistance layer, and an (n+1)-th electrode (n is a natural number greater than or equal to two) in this order in a first direction vertical to a surface of a first electrode, including the first variable resistance layer which is arranged between the second electrode and the first electrode and in which a first conductive filament is capable of growing based on metal supplied from the second electrode, and the n-th variable resistance layer (n is a natural number greater than or equal to two) which is arranged between the n-th electrode and the (n+1)-th electrode and in which an n-th conductive filament whose growth rate is different from the first conductive filament is capable of growing based on metal supplied from the (n+1)-th electrode, and including a configuration in which a plurality of conductive filaments is electrically connected in series between the first electrode layer and the (n+1)-th electrode layer.

Third Embodiment

Figure 7:
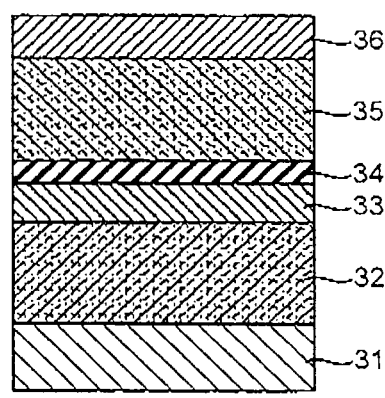
FIG. 7 is a cross-sectional view illustrating a schematic configuration of a nonvolatile resistance change device according to a third embodiment of the invention.

FIG. 7 is a cross-sectional view illustrating a schematic configuration of a nonvolatile resistance change device according to the third embodiment.

In FIG. 7, in this nonvolatile resistance change device, a first electrode 31, a first variable resistance layer 32, a second electrode 33, a diffusion barrier layer 34, a second variable resistance layer 35, and a third electrode 36 are sequentially stacked. The material of the first variable resistance layer 32 and the second variable resistance layer 35 is different from each other. Other points are similar to the configuration in FIG. 1.

For example, non-doped amorphous silicon can be used for the second variable resistance layer 35 and amorphous silicon implanted with $B^+$ ion can be used for the first variable resistance layer 32. The specific resistance of the second variable resistance layer 35 at this time can be set to, for example, $10^3 \Omega \cdot cm$ and the specific resistance of the first variable resistance layer 32 can be set to, for example, $10^2 \Omega \cdot cm$. The film thickness of the first variable resistance layer 32 and the second variable resistance layer 35 can be the same or different from each other. Moreover, in the example in FIG. 7, the method in which ion is implanted in the first variable resistance layer 32 is explained, however, ions can be implanted in the second variable resistance layer 35.

Figure 8A:
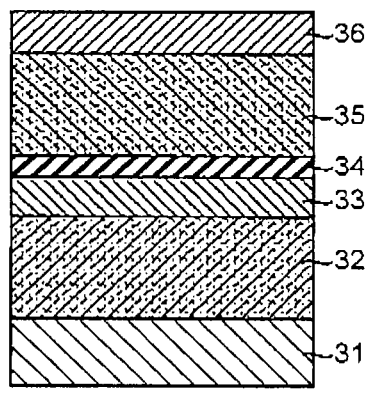
FIG. 8A to FIG. 8C are cross-sectional views illustrating a formation process of a conductive filament at the time of writing of the nonvolatile resistance change device according to the third embodiment.
Figure 8D:
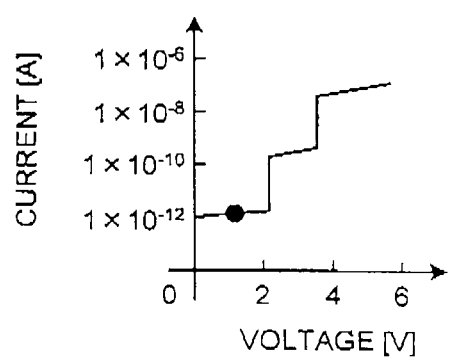
FIG. 8D to FIG. 8F are diagrams illustrating current-voltage characteristics at the time of writing of the nonvolatile resistance change device according to the third embodiment.
Figure 8B:
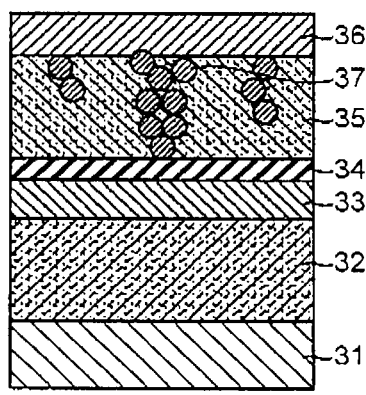
Figure 8E:
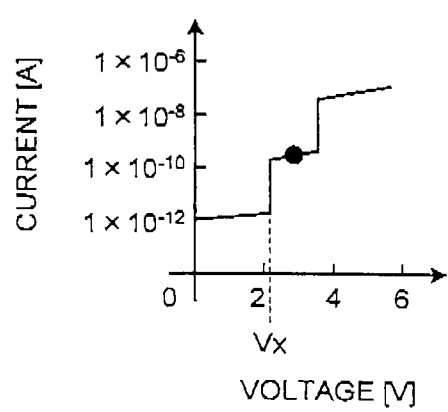
Figure 8C:
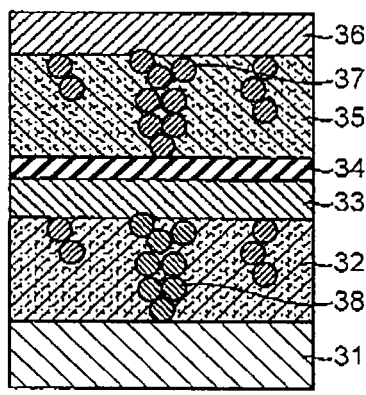
Figure 8F:
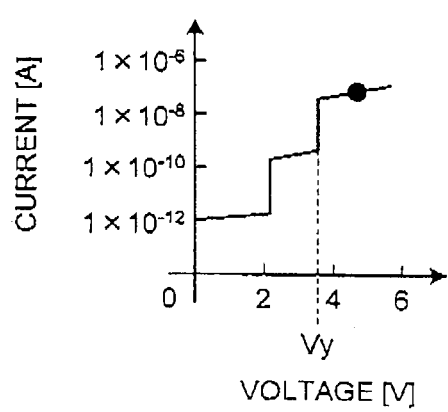

FIG. 8A to FIG. 8C are cross-sectional views illustrating a formation process of a conductive filament at the time of writing of the nonvolatile resistance change device according to the third embodiment, and FIG. 8D to FIG. 8F are diagrams illustrating current-voltage characteristics at the time of writing of the nonvolatile resistance change device according to the third embodiment.

In FIG. 8A, a positive voltage applied to the third electrode 36 with respect to the first electrode 31 from the state where conductive filaments 37 and 38 are not formed. At this time, as shown in FIG. 8D, even if the voltage applied to the third electrode 36 rises, the current that flows between the first electrode 31 and the third electrode 36 is substantially constant.

Then, as shown in FIG. 8E, when the voltage of the third electrode 36 reaches Vx, as shown in FIG. 8B, the conductive filament 37 formed of the metal ions included the third electrode 36 is formed in the second variable resistance layer 35.

This conductive filament 37 is preferentially formed as the metal (atoms or ions) included in the third electrode 36 is diffused more easily or the film thickness of the second variable resistance layer 35 is thinner. When the conductive filament 37 is formed in the second variable resistance layer 35, the specific resistance of the first variable resistance layer 32 mainly contributes as the resistance of the nonvolatile resistance change device.

The current value at the time when the voltage of the third electrode 36 reaches the voltage Vx can be largely changed by performing the ion implantation on the first variable resistance layer 32 and making the specific resistance of the first variable resistance layer 32 smaller than the specific resistance of the second variable resistance layer 35. Moreover, the diffusion rate of the metal atoms in the first variable resistance layer 32 can be modulated depending on the strength of a chemical bond between impurities doped in the first variable resistance layer 32 and metal atoms.

Thereafter, the voltage of the third electrode 36 further rises, and as shown in FIG. 8F, when the voltage of the third electrode 36 reaches Vy, as shown in FIG. 8C, the conductive filament 38 formed of the metal (atoms or ions) included in the second electrode 33 is formed in the first variable resistance layer 32 and the resistance of the nonvolatile resistance change device becomes smaller. The above voltages Vx and Vy are typically in the range of 0.1 V to 15 V. For realizing miniaturization of the nonvolatile resistance change device, the nonvolatile resistance change device is desirably driven at a lower voltage and the voltages Vx and Vy are preferably in the range of 0.1 V to 6 V.

In this manner, multi-level bit capability of the nonvolatile resistance change device can be realized by using the phenomenon that the resistance of the nonvolatile resistance change device changes in a stepwise manner with respect to the applied voltage. In the erase operation again, control of the rate and the degree of retraction of the conductive filament 38 can be efficiently performed by performing the ion implantation on the first variable resistance layer 32.

Figure 9A:
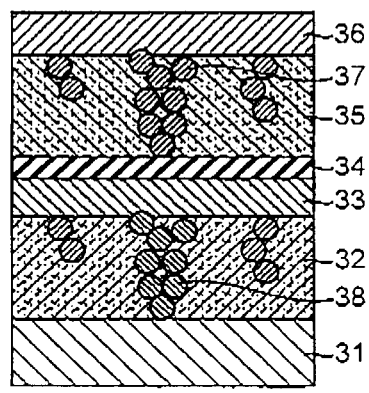
FIG. 9A to FIG. 9C are cross-sectional views illustrating a elimination process of the conductive filament at the time of erasing of the nonvolatile resistance change device according to the third embodiment.
Figure 9D:
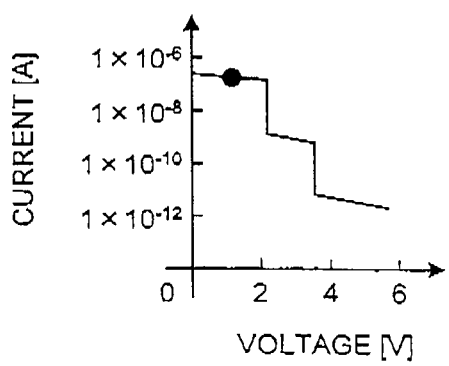
FIG. 9D to FIG. 9F are diagrams illustrating current-voltage characteristics at the time of erasing of the nonvolatile resistance change device according to the third embodiment.
Figure 9B:
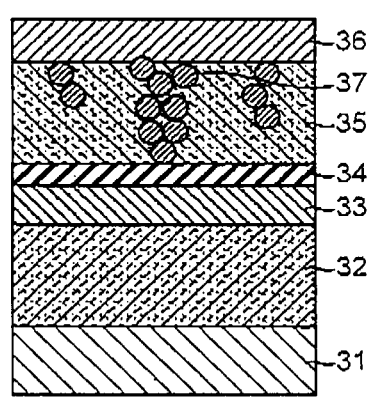
Figure 9E:
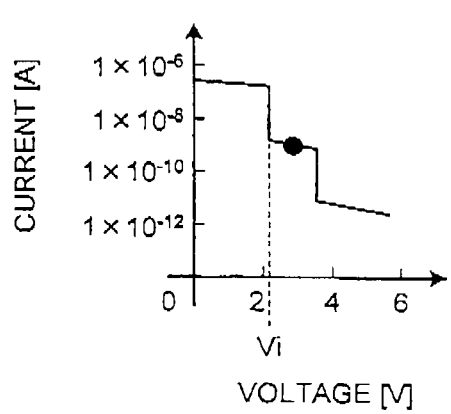
Figure 9C:
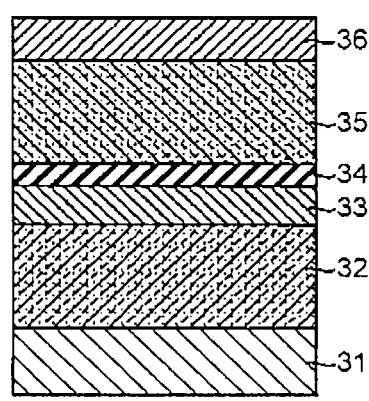
Figure 9F:
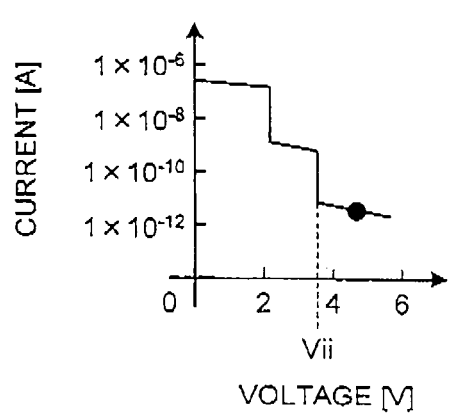

FIG. 9A to FIG. 9C are cross-sectional views illustrating a disappearing process of the conductive filament at the time of erasing of the nonvolatile resistance change device according to the third embodiment, and FIG. 9D to FIG. 9F are diagrams illustrating current-voltage characteristics at the time of erasing of the nonvolatile resistance change device according to the third embodiment.

When causing the conductive filaments 37 and 38 to eliminate from the state of FIG. 9A, as shown in FIG. 9D, a negative voltage applied to the third electrode 36 with respect to the first electrode 31. At this time, injection of holes from the first electrode 31 to the conductive filament 38 occurs and the atoms in the conductive filament 38 are ionized. Then, due to the electric field applied to the conductive filament 38 from the first electrode 31, the metal atoms in the conductive filament 38 are retracted to the second electrode 33 side.

When the voltage applied to the third electrode 36 reaches Vi, the metal atoms that form the conductive filament 38 in the first variable resistance layer 32 return to the second electrode 33, so that the conductive filament 38 retracts, and the conductive filament 38 in the first variable resistance layer 32 finally eliminates as shown in FIG. 9B under the condition where sufficient ionization keeps occurring.

At this time, the current value of the nonvolatile resistance change device decreases in a stepwise manner. This is because the potential difference occurs between the second electrode 33 and the first electrode 31 due to disappearance of the conductive filament 38 in the first variable resistance layer 32 and therefore the resistance of the nonvolatile resistance change device becomes large.

When the conductive filament 38 between the first electrode 31 and the second electrode 33 eliminates, the electric field is applied to the first variable resistance layer 32 that is in contact with the first electrode 31 and the diffusion barrier layer 34. The negative voltage is further applied to the third electrode 36, and, as shown in FIG. 9E, when the voltage reaches Vii, as shown in FIG. 9C, the metal atoms that form the conductive filament 37 in the second variable resistance layer 35 are metal-ionized and return to the direction of the third electrode 36, so that the conductive filament 37 eliminates. The metal ions of the second electrode 33 can be prevented from diffusing in the direction of the third electrode 36 by providing the diffusion barrier layer 34 on the second electrode 33. The above voltages Vi and Vii are typically in the range of −0.1 V to −15 V. For realizing miniaturization of the nonvolatile resistance change device, the nonvolatile resistance change device is desirably driven at a lower voltage and the voltages Vi and Vii are preferably in the range of −0.1 V to −6 v. In the case of the present embodiment, Vi is about −2.5 V and Vii is about −3.2 V.

The hole injection from the first electrode 31 to the conductive filament 38 and the hole injection from the second electrode 33 to the conductive filament 37 can be controlled by the electrical resistivity of the first variable resistance layer 32 and the second variable resistance layer 35. The degree of retraction of the conductive filaments 37 and 38 can be controlled based on the ease of the hole injection to the conductive filaments 37 and 38 and thus can be controlled based on the electrical resistivity of the first variable resistance layer 32 and the second variable resistance layer 35. Moreover, the diffusion rate of the ionized metal in the first variable resistance layer 32 and the second variable resistance layer 35 can be modulated depending on the strength of a chemical bond between impurities doped in the first variable resistance layer 32 and the second variable resistance layer 35 and metal atoms.

It is possible to realize a four or more level nonvolatile resistance change device that is characterized in that a resistance is changed in a stepwise manner by stacking a first variable resistance layer, a second electrode, . . . , an n-th electrode, an n-th variable resistance layer, and an (n+1)-th electrode (n is a natural number greater than or equal to two) in this order in a first direction vertical to a surface of a first electrode, including the first variable resistance layer which is arranged between the second electrode and the first electrode and in which a first conductive filament is capable of growing based on metal supplied from the second electrode, and the n-th variable resistance layer (n is a natural number greater than or equal to two) which is arranged between the n-th electrode and the (n+1)-th electrode and in which an n-th conductive filament whose growth rate is different from the first conductive filament is capable of growing based on metal supplied from the (n+1)-th electrode, and including a configuration in which a plurality of conductive filaments is electrically connected in series between the first electrode layer and the (n+1)-th electrode layer.

Fourth Embodiment

Figure 10A:
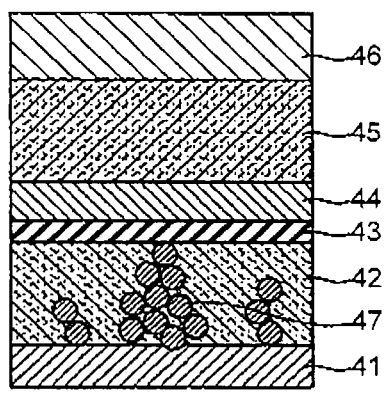
FIG. 10A is a cross-sectional view illustrating a first on-state of a nonvolatile resistance change device according to a fourth embodiment.
Figure 10B:
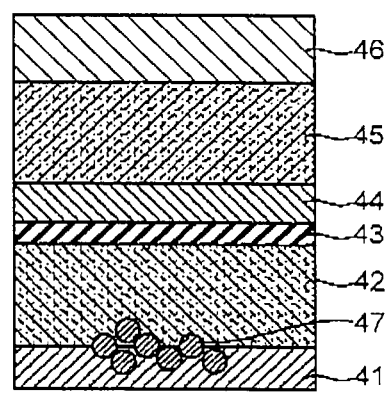
FIG. 10B is a cross-sectional view illustrating an off-state of the nonvolatile resistance change device according to the fourth embodiment.

FIG. 10A is a cross-sectional view illustrating a first on-state of a nonvolatile resistance change device according to the fourth embodiment, and FIG. 10B is a cross-sectional view illustrating an off-state of the nonvolatile resistance change device according to the fourth embodiment.

In FIG. 10A, in this nonvolatile resistance change device, a first electrode 41, a first variable resistance layer 42, a diffusion barrier layer 43, a second electrode 44, a second variable resistance layer 45, and a third electrode 46 are sequentially stacked. The first electrode 41 has a configuration similar to the third electrode 16 in FIG. 1. The second electrode 44 has a configuration similar to the second electrode 13 in FIG. 1. The third electrode 46 has a configuration similar to the first electrode 11 in FIG. 1. The first variable resistance layer 42 has a configuration similar to the second variable resistance layer 15 in FIG. 1. The second variable resistance layer 45 has a configuration similar to the first variable resistance layer 12 in FIG. 1. The diffusion barrier layer 43 has a configuration similar to the diffusion barrier layer 14 in FIG. 1.

Then, the metal (atoms or ions) included in the first electrode 41 is diffused in the first variable resistance layer 42 by applying a voltage with which the third electrode 46 becomes negative with respect to the first electrode 41, whereby a conductive filament 47 is formed. The conductive filament 47 is formed of metal and thus has a high conductivity, so that the resistance of the first variable resistance layer 42 becomes lower than the state where the conductive filament 47 is not formed.

When a positive voltage applied to the third electrode 46 with respect to the first electrode 41 from the state of FIG. 10A, as shown in FIG. 10B, the metal (atoms or ions) that is present in the first variable resistance layer 42 returns to the first electrode 41 side, so that the conductive filament 47 disappears. Consequently, the resistance of the first variable resistance layer 42 becomes higher than the state of FIG. 10A.

When a negative voltage applied to the third electrode 46 with respect to the first electrode 41 from the state of FIG. 10B, as shown in FIG. 10A, the conductive filament 47 is formed again. In other words, the state of FIG. 10A and the state of FIG. 10B can be reversibly controlled. These two states correspond to an on-state and an off-state, respectively, so that a binary nonvolatile resistance change memory can be realized.

Moreover, after formation the conductive filament 47 in the first variable resistance layer 42, a conductive filament can be formed and caused to eliminate in the second variable resistance layer 45 separately from the conductive filament 47. When the state where a conductive filament is not formed in the first variable resistance layer 42 and the second variable resistance layer 45 corresponds to an off-state, the state where the conductive filament 47 is formed in the first variable resistance layer 42 corresponds to a first on-state, and the state where a conductive filament is formed in the first variable resistance layer 42 and the second variable resistance layer 45 corresponds to a second on-state, these three states can be reversibly changed, so that a three-level nonvolatile resistance change memory can be realized.

Next, the manufacturing method of the nonvolatile resistance change device in FIG. 10A is explained.

The first electrode 41 is formed of metal, for example, Ag whose diffusion rate in Si is fast, and amorphous silicon or polysilicon is deposited thereon as the first variable resistance layer 42. Next, the diffusion barrier layer 43 is stacked on the first variable resistance layer 42.

Thereafter, metal to be the second electrode 44, for example, Ti whose diffusion rate in Si is slow is deposited. Amorphous silicon or polysilicon is deposited thereon as the second variable resistance layer 45. Moreover, a p-type Si is formed as the third electrode 46 on the second variable resistance layer 45 so that the sheet resistance becomes, for example, 3 to $3 \times 10^3 \Omega/\square$.

The present invention is explained in detail above based on the specific examples, however, the present invention is not limited to the above specific examples and all modifications and changes can be made without departing from the scope of the present invention. For example, it is applicable to control the diffusion rate of electrons and holes in the variable resistance layer by changing the specific resistance of the variable resistance layer by ion-implanting B, P, As, $BF_2$, or the like in amorphous silicon or polysilicon that is the variable resistance layer.

Moreover, it is possible to modulate the diffusion rate of metal atoms in the variable resistance layer depending on the strength of a chemical bond between impurities doped in the variable resistance layer and metal atoms. For realizing the operation according to the physical principle of formation and elimination of a filament described above, it is applicable to use metal different in diffusion rate in the variable resistance layer in each electrode layer, control the electrical resistivity of the variable resistance layer, or use the diffusion barrier layer in which the dielectric constant is controlled.

In other words, multi-level bit capability can be realized by the method explained in each embodiment by employing the configuration in which a plurality of conductive filaments formed of metals whose diffusion rate is different in respective variable resistance layers is connected in series between the first electrode layer and the third electrode layer. Moreover, the present invention relates to a technology of a single memory cell and the present invention can be applied to any circuit without depending on a connection method of the memory cell.

Fifth Embodiment

Figure 11A:
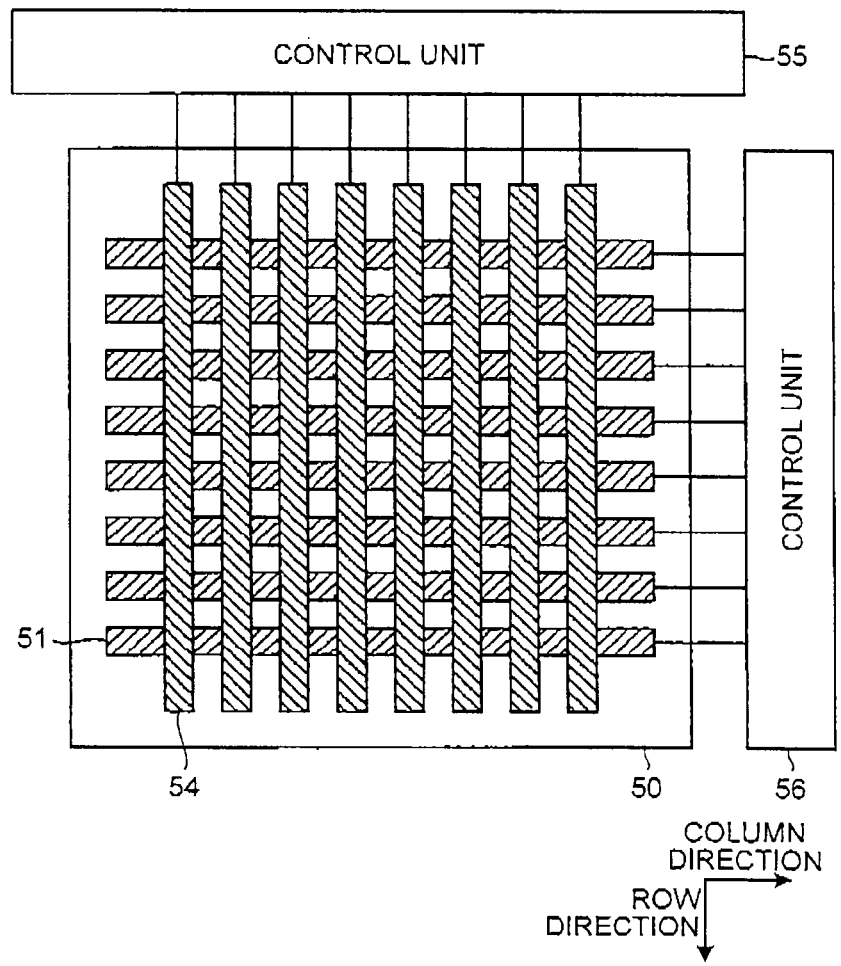
FIG. 11A is a plan view illustrating a schematic configuration of a memory cell array to which nonvolatile resistance change device according to a fifth embodiment are applied.
Figure 11B:
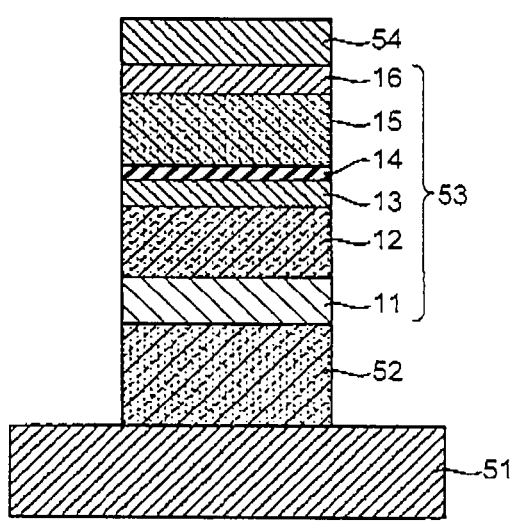
FIG. 11B is a cross-sectional view illustrating a schematic configuration of a cross-section of the memory cell array in FIG. 11A.

FIG. 11A is a plan view illustrating a schematic configuration of a memory cell array to which nonvolatile resistance change devices according to the fifth embodiment are applied, and FIG. 11B is a cross-sectional view illustrating a schematic configuration of a cross-section of the memory cell array in FIG. 11A.

In FIG. 11A and FIG. 11B, in a memory cell array 50, lower line 51 are formed in a column direction and upper line 54 are formed in a row direction. A memory cell 53 is arranged at the cross-section of the lower line 51 and the upper line 54 via a rectifier cell 52. As the memory cell 53, for example, the nonvolatile resistance change device in FIG. 1, FIG. 5, or FIG. 7 can be used. Moreover, a control unit 55 that performs a row control and a control unit 55 that performs a column control are provided around the memory cell array 50.

Figure 12:
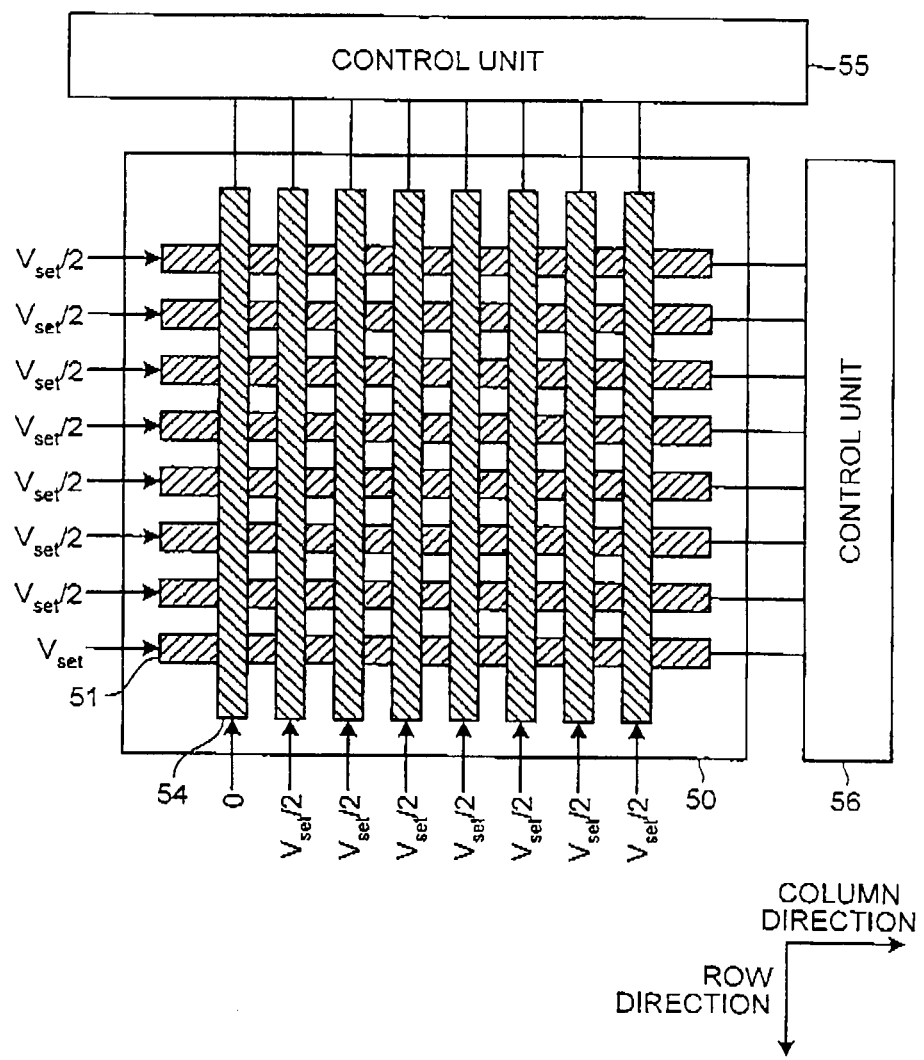
FIG. 12 is a plan view illustrating a voltage setting method at the time of writing of a selected cell in the memory cell array in FIG. 11A.

FIG. 12 is a plan view illustrating a voltage setting method at the time of writing of a selected cell in the memory cell array in FIG. 11A.

In FIG. 12, when performing writing in the selected cell, a set voltage $V_{set}$ is applied to the lower line 51 of the selected column and a voltage that is ½ of the set voltage $V_{set}$ is applied to the lower lines 51 of the non-selected columns. Moreover, 0 V is applied to the upper line 54 of the selected row and a voltage that is ½ of the set voltage $V_{set}$ is applied to the upper lines 54 of the non-selected rows.

Consequently, the set voltage $V_{set}$ is applied to the selected cell specified by the selected column and the selected row and writing is performed. On the other hand, a voltage that is ½ of the set voltage $V_{set}$ is applied to the half-selected cells specified by the non-selected columns and the selected row and writing is prohibited. Moreover, a voltage that is ½ of the set voltage $V_{set}$ is applied to the half-selected cells specified by the selected column and the non-selected rows and writing is prohibited. Furthermore, 0 V is applied to the non-selected cells specified by the non-selected columns and the non-selected rows and writing is prohibited.

Figure 13:
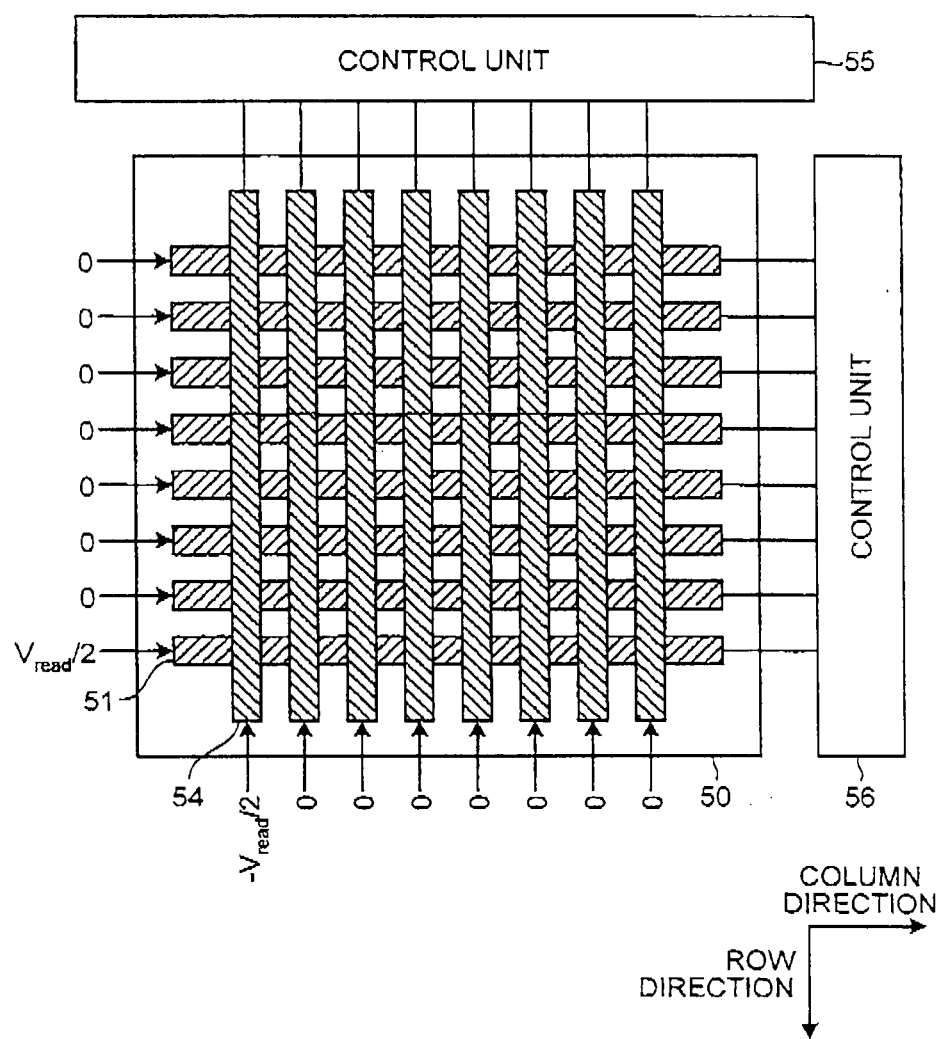
FIG. 13 is a plan view illustrating a voltage setting method at the time of reading of a selected cell in the memory cell array in FIG. 11A.

FIG. 13 is a plan view illustrating a voltage setting method at the time of reading of a selected cell in the memory cell array in FIG. 11A.

In FIG. 13, when performing reading of the selected cell, a voltage that is ½ of a read voltage $V_{read}$ is applied to the lower line 51 of the selected column and 0 V is applied to the lower lines 51 of the non-selected columns. Moreover, a voltage that is −½ of the read voltage $V_{read}$ is applied to the upper line 54 of the selected row and 0 V is applied to the upper lines 54 of the non-selected rows.

Consequently, the read voltage $V_{read}$ is applied to the selected cell specified by the selected column and the selected row and reading is performed. On the other hand, a voltage that is −½ of the read voltage $V_{read}$ is applied to the half-selected cells specified by the non-selected columns and the selected row and reading is prohibited. Moreover, a voltage that is ½ of the read voltage $V_{read}$ is applied to the half-selected cells specified by the selected column and the non-selected rows and reading is prohibited. Furthermore, 0 V is applied to the non-selected cells specified by the non-selected columns and the non-selected rows and reading is prohibited.

Figure 14:
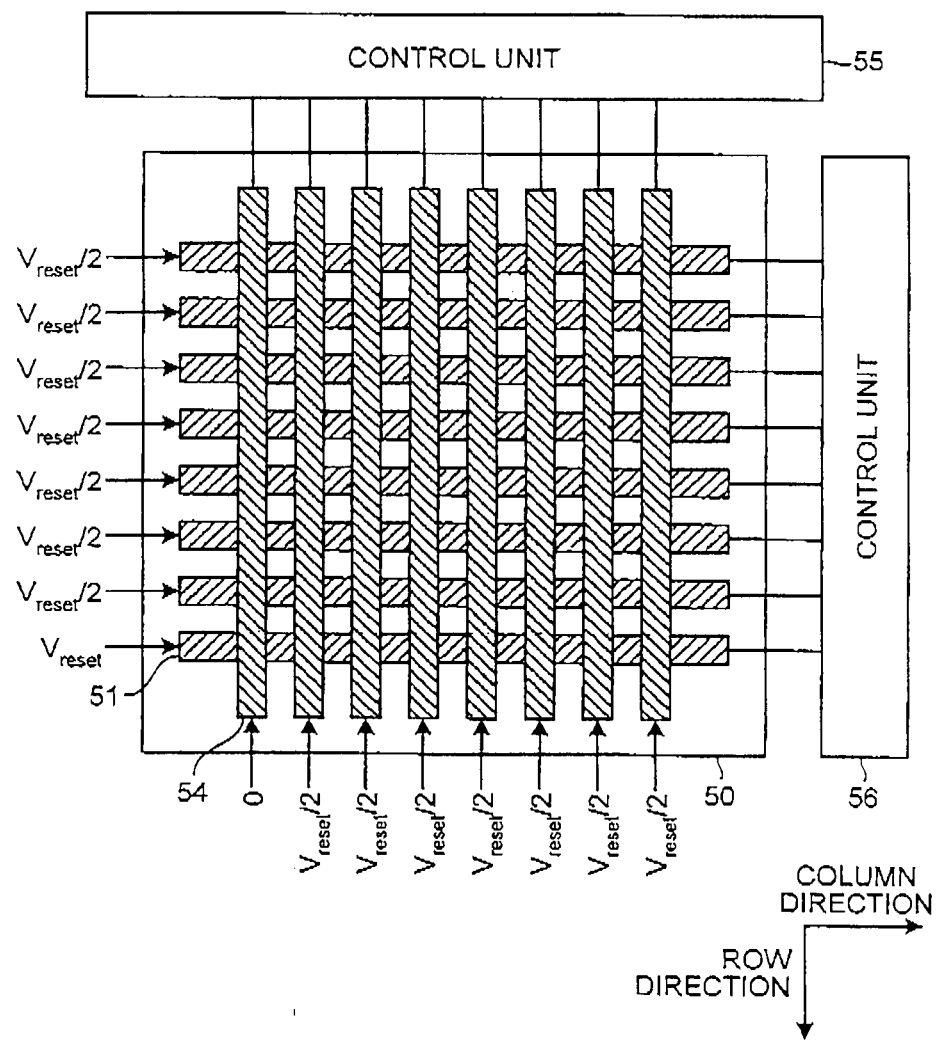
FIG. 14 is a plan view illustrating a voltage setting method at the time of erasing of a selected cell in the memory cell array in FIG. 11A.

FIG. 14 is a two-dimensional diagram illustrating a voltage setting method at the time of erasing of a selected cell in the memory cell array in FIG. 11A.

In FIG. 14, when performing erasing of the selected cell, a reset voltage $V_{reset}$ is applied to the lower line 51 of the selected column and a voltage that is ½ of the reset voltage $V_{reset}$ is applied to the lower lines 51 of the non-selected columns. Moreover, 0 V is applied to the upper line 54 of the selected row and a voltage that is ½ of the reset voltage $V_{reset}$ is applied to the upper lines 54 of the non-selected rows.

Consequently, the reset voltage $V_{reset}$ is applied to the selected cell specified by the selected column and the selected row and erasing is performed. On the other hand, a voltage that is ½ of the reset voltage $V_{reset}$ is applied to the half-selected cells specified by the non-selected columns and the selected row and erasing is prohibited. Moreover, a voltage that is ½ of the reset voltage $V_{reset}$ is applied to the half-selected cells specified by the selected column and the non-selected rows and erasing is prohibited. Furthermore, 0 V is applied to the non-selected cells specified by the non-selected columns and the non-selected rows and erasing is prohibited.

Sixth Embodiment

Figure 15:
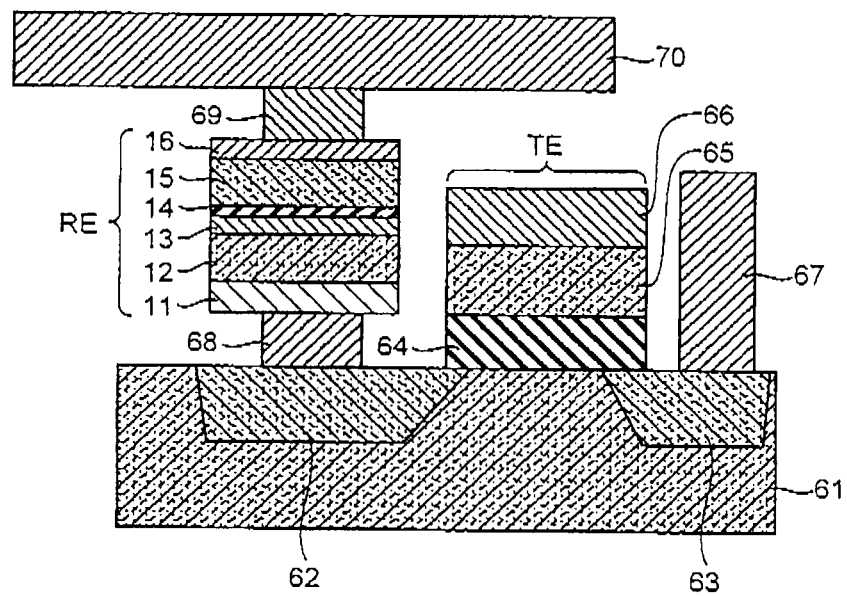
FIG. 15 is a cross-sectional view illustrating a schematic configuration of a nonvolatile resistance change device according to a sixth embodiment.

FIG. 15 is a cross-sectional view illustrating a schematic configuration of a nonvolatile resistance change device according to the sixth embodiment.

In FIG. 15, on a semiconductor substrate 61, a gate electrode 65 is formed via a gate dielectric film 64 and a word line 66 is formed on the gate electrode 65. In the semiconductor substrate 61, impurity diffusion layers 62 and 63 are formed to sandwich a channel region formed below the gate electrode 65, thereby forming a transistor TE. A source line 67 is connected to the impurity diffusion layer 63.

Moreover, on the semiconductor substrate 61, a nonvolatile resistance change device RE is arranged adjacent to the transistor TE. For example, the nonvolatile resistance change device RE can have a configuration similar to that in FIG. 1. The first electrode 11 of the nonvolatile resistance change device RE is connected to the impurity diffusion layer 62 via a connection conductor 68 and the third electrode 16 of the nonvolatile resistance change device RE is connected to a bit line 70 via a connection conductor 69.

When the transistor TE is turned on via the word line 66, it is possible to access the nonvolatile resistance change device RE, enabling to select the nonvolatile resistance change device RE to be a read and write target.

In the example in FIG. 15, the case is explained in which the configuration in FIG. 1 is used as the nonvolatile resistance change device RE, however, the configuration in FIG. 5 or FIG. 7 can also be used.

Figure 16:
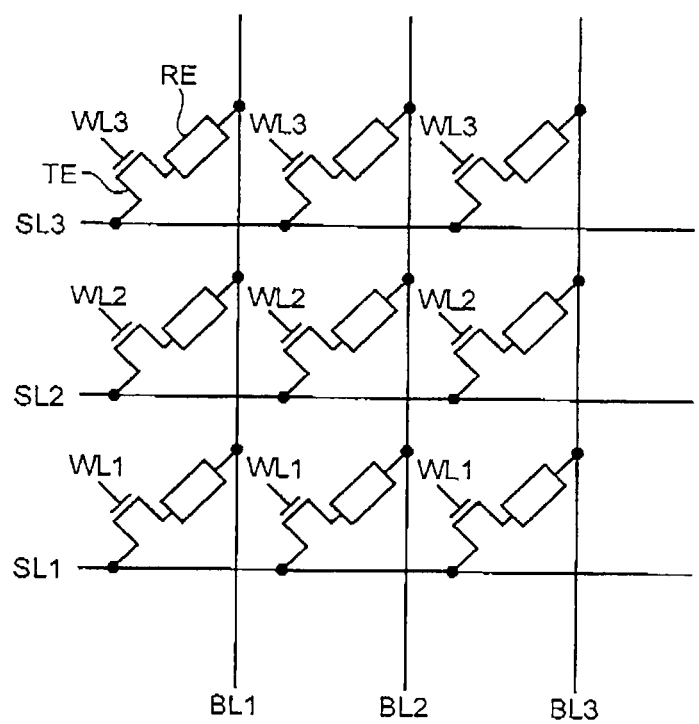
FIG. 16 is a plan view illustrating a schematic configuration of a memory cell array to which the nonvolatile resistance change devices in FIG. 15 are applied.

FIG. 16 is a two-dimensional diagram illustrating a schematic configuration of a memory cell array to which the nonvolatile resistance change devices in FIG. 15 are applied.

In FIG. 16, on the semiconductor substrate 61 in FIG. 15, bit lines BL1 to BL3 are wired in a column direction and word lines WL1 to WL3 are wired in a row direction. At each cross-section of the bit lines BL1 to BL3 and the word lines WL1 to WL3, the nonvolatile resistance change device RE and the transistor TE are arranged and the nonvolatile resistance change device RE and the transistor TE are connected in series with each other.

One ends of the nonvolatile resistance change devices RE in the same column are connected to the same bit line of the bit lines BL1 to BL3 and one ends of the transistors TE in the same row are connected to the same source line of source lines SL1 to SL3. Moreover, the gate electrodes 65 of the transistors TE in the same row are connected to the same word line of the word lines WL1 to WL3.

A voltage can be applied between the first electrode 11 and the second electrode 13 of the nonvolatile resistance change device RE of a selected row by turning on the transistor TE via the word line of the word lines WL1 to WL3. Therefore, it is possible to prevent current from flowing in the nonvolatile resistance change devices RE of non-selected rows at the time of reading of the nonvolatile resistance change device RE of the selected row, whereby the read time can be shortened.

Seventh Embodiment

Figure 17:
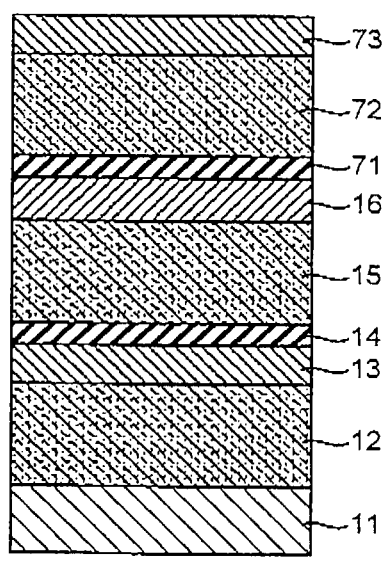
FIG. 17 is a cross-sectional view illustrating a schematic configuration of a nonvolatile resistance change device according to a seventh embodiment.
Figure 18A:
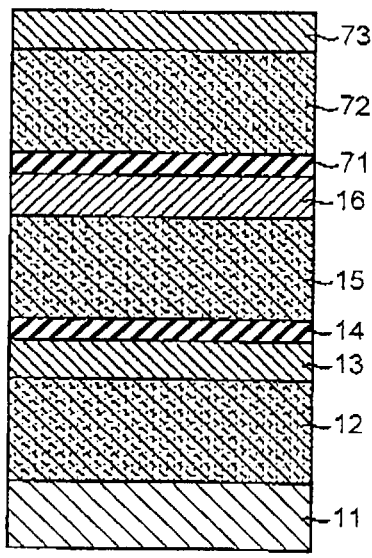
FIG. 18A to FIG. 18D are cross-sectional views illustrating a forming process of a conductive filament at the time of writing of the nonvolatile resistance change device according to the seventh embodiment.
Figure 18C:
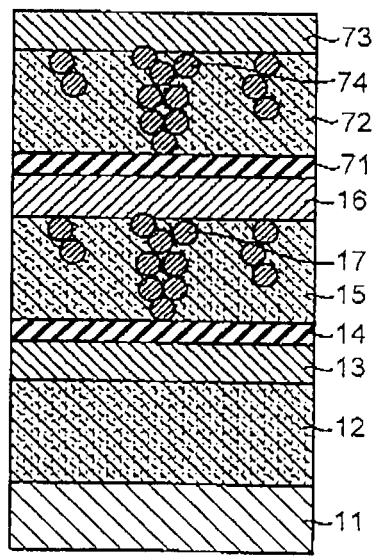
Figure 18B:
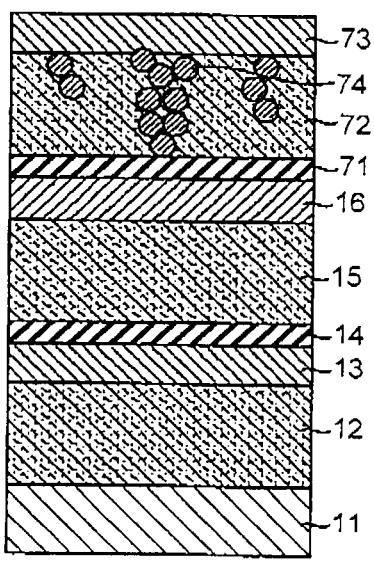
Figure 18D:
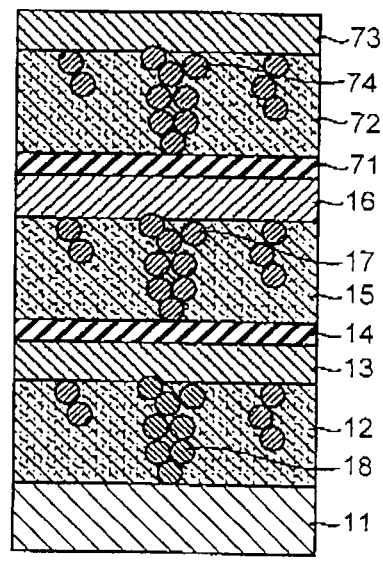

FIG. 17 is a cross-sectional view illustrating a schematic configuration of a nonvolatile resistance change device according to the seventh embodiment.

In FIG. 17, the first variable resistance layer 12 is arranged between the first electrode 11 and the second electrode 13, and the second variable resistance layer 15 is arranged between the second electrode 13 and the third electrode 16. Moreover, a third variable resistance layer 72 is arranged between the third electrode 16 and a fourth electrode 73.

In the first variable resistance layer 12, a first conductive filament can grow based on metal supplied from the second electrode 13. In the second variable resistance layer 15, a second conductive filament can grow based on metal supplied from the third electrode 16. In the third variable resistance layer 72, a third conductive filament can grow based on metal supplied from the fourth electrode 73.

The growth rate of the first conductive filament grown in the first variable resistance layer 12 can be made lower than the growth rate of the second conductive filament grown in the second variable resistance layer 15. The growth rate of the second conductive filament grown in the second variable resistance layer 15 can be made lower than the growth rate of the third conductive filament grown in the third variable resistance layer 72.

Moreover, the diffusion barrier layer 14 that prevents the metal supplied from the third electrode 16 from diffusing and mixing with the second electrode 13 or prevents the metal of the second electrode 13 from diffusing in the second variable resistance layer 15 is arranged between the second electrode 13 and the second variable resistance layer 15. A diffusion barrier layer 71 that prevents the metal supplied from the fourth electrode 73 from diffusing and mixing with the third electrode 16 or prevents the metal of the third electrode 16 from diffusing in the third variable resistance layer 72 is arranged between the third electrode 16 and the third variable resistance layer 72.

A metal element can be the main component of the second electrode 13, the third electrode 16, and the fourth electrode 73. Moreover, the metal included in the second electrode 13, the metal included in the third electrode 16, and the metal included in the fourth electrode 73 are selected to be different from each other. Furthermore, amorphous silicon or polysilicon can be the main component of the first variable resistance layer 12, the second variable resistance layer 15, and the third variable resistance layer 72.

The metal included in the second electrode 13, the metal included in the third electrode 16, and the metal included in the fourth electrode 73 can be selected so that at least any one of the diffusion rate in amorphous silicon or polysilicon, and the diffusion activation barrier or the electrical specific resistance in the neutral atom state and the ionized state is different from each other.

For example, when Si is the main component of the first variable resistance layer 12, the second variable resistance layer 15, and the third variable resistance layer 72, the metal material which is applicable to the second electrode 13, the third electrode 16, and the fourth electrode 73 and whose diffusion rate in Si is fast includes Ag, Cu, Ni, Fe, Ru, Cr, Ir, Au, Pt, Co, and the like. The metal material whose diffusion rate in Si is slow includes Ti, Hf, Zr, Ta, Al, W, and the like.

Moreover, the film thickness of the first variable resistance layer 12, the second variable resistance layer 15, and the third variable resistance layer 72 can be typically set to 1 nm to 300 nm, and can be set to, for example, 150 nm. For miniaturizing the nonvolatile resistance change device, the film thickness of the first variable resistance layer 12, the second variable resistance layer 15, and the third variable resistance layer 72 is preferably thinner, however, if the film thickness is too thin, a uniform film cannot be formed, so that the film thickness thereof is more preferably 2 nm to 50 nm.

Furthermore, the film thickness of the first electrode 11, the second electrode 13, the third electrode 16, and the fourth electrode 73 can be typically set to 1 nm to 200 nm, and can be set to, for example, 50 nm. The film thickness of the first electrode 11, the second electrode 13, the third electrode 16, and the fourth electrode 73 can be different from each other.

Moreover, the diffusion barrier layer 14 and the diffusion barrier layer 71 can be formed of a material whose dielectric constant is different from amorphous silicon or polysilicon used as the first variable resistance layer 12, the second variable resistance layer 15, and the third variable resistance layer 72 or a material whose diffusion rate of metal is low such as oxide, nitride, boride, or oxynitride of Ti, Zr, Ta, W, or Si. For example, as a material whose dielectric constant is higher than amorphous silicon or polysilicon, $Ta_2O_5$, $La_2O_3$, $HfO_2$, $ZrO_2$, $ZrAl_xO_y$, $HfAl_xO_y$, or the like can be used. As a material whose dielectric constant is lower than amorphous silicon or polysilicon, $SiO_2$, $Si_3N_4$, $Al_2O_3$, or the like can be used.

For example, as the diffusion barrier layer 14 and the diffusion barrier layer 71, an $SiO_2$ film whose dielectric constant is lower than the second variable resistance layer 15 can be used. The diffusion barrier layer 14 and the diffusion barrier layer 71 preferably have a thickness of 100 nm or less. The resistance value increases in some cases by interposing the diffusion barrier layer 14 between the second electrode 13 and the second variable resistance layer 15 and interposing the diffusion barrier layer 71 between the third electrode 16 and the third variable resistance layer 72, however, the resistance value of the nonvolatile resistance change device can be suppressed by setting the thickness of the diffusion barrier layer 14 and the diffusion barrier layer 71 to be 100 nm or less. Then, a conductive filament is formed in any one of the first variable resistance layer 12, the second variable resistance layer 15, and the third variable resistance layer 72, a conductive filament is formed in any two of the first variable resistance layer 12, the second variable resistance layer 15, and the third variable resistance layer 72, a conductive filament is formed in all of the first variable resistance layer 12, the second variable resistance layer 15, and the third variable resistance layer 72, or conductive filaments of the first variable resistance layer 12, the second variable resistance layer 15, and the third variable resistance layer 72 are caused to disappear, to realize four-level bit capability of the nonvolatile resistance change device.

FIG. 16A to FIG. 18D are cross-sectional views illustrating a formation process of a conductive filament at the time of writing of the nonvolatile resistance change device according to the seventh embodiment.

In FIG. 18A to FIG. 18D, when the voltage applied to the fourth electrode 73 rises from the state of FIG. 12A, a conductive filament 74, the conductive filament 17, and the conductive filament 18 are sequentially formed. Therefore, the resistance of the nonvolatile resistance change device decreases in a stepwise manner and thus four-level bit capability of the nonvolatile resistance change device can be realized.

It is applicable that the first variable resistance layer 12, the second variable resistance layer 15, and the third variable resistance layer 72 are such that the material is different from each other, the specific resistance is different from each other, or the film thickness is different from each other.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would include within the scope and spirit of the inventions.

What is claimed is:

1. A nonvolatile resistance change device comprising:
a first variable resistance layer, a second electrode, . . . , an n-th electrode, an n-th variable resistance layer, and an (n+1)-th electrode (n is a natural number greater than or equal to two) are stacked in this order in a first direction vertical to a surface of a first electrode,
wherein
the first variable resistance layer includes a first conductive filament being capable of growing based on metal supplied from the second electrode, and
the n-th variable resistance layer includes an n-th conductive filament being capable of growing based on metal supplied from the (n+1)-th electrode, and whose growth rate is different from the first conductive filament, and
a resistance of the device can be changed in a stepwise manner.

2. The nonvolatile resistance change device according to claim 1, further comprising a diffusion barrier layer that is arranged between the n-th electrode and the n-th variable resistance layer.

3. The nonvolatile resistance change device according to claim 2, wherein the diffusion barrier layer is formed of a material whose dielectric constant is different from the n-th variable resistance layer, or oxide, nitride, boride, or oxynitride of Ti, Zr, Ta, W, or Si.

4. The nonvolatile resistance change device according to claim 1, wherein
the first electrode is formed of impurity-doped silicon,
a metal element is a main component of the second electrode to the (n+1)-th electrode, and
silicon is a main component of the first variable resistance layer to the n-th variable resistance layer.

5. The nonvolatile resistance change device according to claim 4, wherein the first electrode is formed of a p-type Si.

6. The nonvolatile resistance change device according to claim 4, wherein the metal supplied from the second electrode and metal supplied from a third electrode are different from each other in at least any one of a diffusion rate in the silicon, a diffusion activation barrier in a neutral atom state or an ionized state, or an electrical specific resistance.

7. The nonvolatile resistance change device according to claim 6, wherein
the n-th electrode includes at least one of Ag, Cu, Ni, Fe, Ru, Cr, Au, Pt, Co, Ir, Ti, Ta, W, Al, Hf, and Zr, and
the (n+1)-th electrode includes at least one metal whose diffusion rate in the silicon is different from metal included in the n-th electrode among Ag, Cu, Ni, Fe, Cr, Au, Pt, Co, Ir, Ti, Ta, W, Al, Hf, and Zr.

8. The nonvolatile resistance change device according to claim 4, wherein the metal supplied from the second electrode and metal supplied from a third electrode are different from each other in a cohesive energy.

9. The nonvolatile resistance change device according to claim 1, wherein the first variable resistance layer and the n-th variable resistance layer are different from each other in a film thickness.

10. The nonvolatile resistance change device according to claim 1, wherein impurity is doped in at least any one of the first variable resistance layer to the n-th variable resistance layer.

11. A nonvolatile resistance change device comprising:
a first electrode;
a second electrode;
a third electrode;
a first variable resistance layer arranged between the first electrode and the second electrode, a first conductive filament being capable of growing based on metal supplied from the second electrode; and
a second variable resistance layer arranged between the second electrode and the third electrode, a second conductive filament being capable of growing based on metal supplied from the third electrode, and whose growth rate is different from the first conductive filament.

12. The nonvolatile resistance change device according to claim 11, further comprising a diffusion barrier layer that is arranged between the second electrode and the second variable resistance layer.

13. The nonvolatile resistance change device according to claim 12, wherein the diffusion barrier layer is formed of a material whose dielectric constant is different from the second variable resistance layer, or oxide, nitride, boride, or oxynitride of Ti, Zr, Ta, W, or Si.

14. The nonvolatile resistance change device according to claim 11, wherein
the first electrode is formed of impurity-doped silicon,
a metal element is a main component of the second electrode and the third electrode, and
silicon is a main component of the first variable resistance layer and the second variable resistance layer.

15. The nonvolatile resistance change device according to claim 14, wherein the first electrode is formed of a p-type Si.

16. The nonvolatile resistance change device according to claim 14, wherein the metal supplied from the second electrode and metal supplied from a third electrode are different from each other in at least any one of a diffusion rate in the silicon, a diffusion activation barrier in a neutral atom state or an ionized state, or an electrical specific resistance.

17. The nonvolatile resistance change device according to claim 16, wherein
the second electrode includes at least one of Ag, Cu, Ni, Fe, Ru, Cr, Au, Pt, Co, Ir, Ti, Ta, W, Al, Hf, and Zr, and
the third electrode includes at least one metal whose diffusion rate in the silicon is higher than metal included in the second electrode among Ag, Cu, Ni, Fe, Cr, Au, Pt, Co, Ir, Ti, Ta, W, Al, Hf, and Zr.

18. The nonvolatile resistance change device according to claim 14, wherein the metal supplied from the second electrode and metal supplied from a third electrode are different from each other in a cohesive energy.

19. The nonvolatile resistance change device according to claim 11, wherein the first variable resistance layer and the second variable resistance layer are different from each other in a film thickness.

20. The nonvolatile resistance change device according to claim 11, wherein impurity is doped in at least any one of the first variable resistance layer and the second variable resistance layer.

* * * * *